United States Patent
Rapp et al.

(10) Patent No.: US 7,682,775 B2
(45) Date of Patent: Mar. 23, 2010

(54) PROCESS FOR PREPARING A FLEXOGRAPHIC PRINTING PLATE

(75) Inventors: Sabine Rapp, Dreieich (DE); Thies Knudsen, Offenbach/M. (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 404 days.

(21) Appl. No.: 11/069,607

(22) Filed: Mar. 1, 2005

(65) Prior Publication Data

US 2005/0196701 A1    Sep. 8, 2005

Related U.S. Application Data

(60) Provisional application No. 60/550,429, filed on Mar. 5, 2004.

(51) Int. Cl.
G03F 7/00 (2006.01)
G03F 7/26 (2006.01)

(52) U.S. Cl. .................. 430/302; 430/306

(58) Field of Classification Search .......... 430/300, 430/306
See application file for complete search history.

(56) References Cited

U.S. PATENT DOCUMENTS

| | | | |
|---|---|---|---|
| 2,760,863 A | 8/1956 | Plambeck, Jr. |
| 3,036,913 A | 5/1962 | Burg |
| 3,264,103 A | 8/1966 | Cohen et al. |
| 3,796,602 A | 3/1974 | Briney et al. |
| 4,046,071 A | 9/1977 | Mizuno et al. |
| 4,323,636 A | 4/1982 | Chen |
| 4,323,637 A | 4/1982 | Chen et al. |
| 4,427,759 A | 1/1984 | Gruetzmacher et al. |
| 4,460,675 A | 7/1984 | Gruetzmacher et al. |
| 4,726,877 A | 2/1988 | Fryd et al. |
| 4,753,865 A | 6/1988 | Fryd et al. |
| 4,806,506 A | 2/1989 | Gibson, Jr. |
| 4,894,315 A | 1/1990 | Feinberg et al. |
| 4,956,252 A | 9/1990 | Fryd et al. |
| 5,015,556 A | 5/1991 | Martens |
| 5,175,072 A | 12/1992 | Martens |
| 5,215,859 A | 6/1993 | Martens |
| 5,262,275 A | 11/1993 | Fan |
| 5,279,697 A | 1/1994 | Peterson et al. |
| 5,292,617 A | 3/1994 | Feinberg et al. |
| 5,468,596 A | 11/1995 | Loerzer et al. |
| 5,552,263 A | 9/1996 | Schober et al. |
| 5,607,814 A | 3/1997 | Fan et al. |
| 5,654,125 A * | 8/1997 | Fan et al. ................. 430/306 |
| 5,707,773 A | 1/1998 | Grossman et al. |
| 5,719,009 A | 2/1998 | Fan |
| 5,766,819 A | 6/1998 | Blanchet-Fincher |
| 5,840,463 A | 11/1998 | Blanchet-Fincher |
| 5,888,701 A * | 3/1999 | Fan ........................ 430/306 |
| 5,972,565 A | 10/1999 | Dudek et al. |
| 6,037,102 A * | 3/2000 | Loerzer et al. ............ 430/306 |
| 6,284,431 B1 * | 9/2001 | Tanizaki et al. ......... 430/273.1 |
| 6,367,381 B1 * | 4/2002 | Kanga ..................... 101/395 |
| 6,383,692 B1 * | 5/2002 | Leenders et al. ............ 430/5 |
| 6,413,699 B1 * | 7/2002 | Kanga ..................... 430/302 |
| 6,472,121 B2 * | 10/2002 | Murphy et al. .......... 430/273.1 |
| 6,531,263 B2 * | 3/2003 | Knoll ..................... 430/287.1 |
| 7,036,430 B2 * | 5/2006 | Figov et al. ............. 101/463.1 |
| 7,122,295 B2 * | 10/2006 | Mengel et al. ............ 430/306 |
| 2005/0142480 A1 * | 6/2005 | Bode et al. ............. 430/270.1 |

FOREIGN PATENT DOCUMENTS

| | | |
|---|---|---|
| DE | 3828551 A1 | 3/1990 |
| DE | 3828551 C2 | 6/1990 |
| DE | 19909152 A1 | 9/2000 |
| DE | 19909152 C2 | 6/2001 |
| EP | 0017927 B1 | 10/1980 |
| EP | 0741330 B1 | 11/1996 |
| EP | 0767407 B2 | 4/1997 |
| EP | 0891877 B1 | 1/1999 |
| WO | WO 94/03838 | 2/1994 |
| WO | WO 94/03839 | 2/1994 |
| WO | WO 96/16356 | 5/1996 |
| WO | WO 98/13730 | 4/1998 |
| WO | WO 01/18604 A2 | 3/2001 |
| WO | WO 03/079114 A1 | 9/2003 |

OTHER PUBLICATIONS www.cyrel.dupont.com, 2005.*

* cited by examiner

*Primary Examiner*—Cynthia H Kelly
*Assistant Examiner*—Connie P Johnson
(74) *Attorney, Agent, or Firm*—Thomas H. Magee

(57) ABSTRACT

A process for preparing a flexographic printing plate comprising providing a photosensitive element comprising a support and at least one photopolymerizable layer, providing a photomask adjacent the photopolymerizable layer opposite the support, exposing the photosensitive element with ultraviolet radiation between 200 and 300 nm through the photomask, exposing the photosensitive element with ultraviolet radiation between 310 and 400 nm through the photomask to photopolymerize areas of the photopolymerizable layer, and treating the exposed photosensitive element to remove unpolymerized areas, thereby forming a relief surface suitable for printing.

13 Claims, No Drawings

PROCESS FOR PREPARING A FLEXOGRAPHIC PRINTING PLATE

FIELD OF THE INVENTION

This invention pertains to a process for preparing a flexographic printing plate by imagewise exposing and developing a photosensitive element.

BACKGROUND OF THE INVENTION

Flexographic printing plates are well known for use in relief printing on a variety of substrates such as paper, corrugated board, films, foils and laminates. Flexographic printing plates can be prepared from photosensitive elements comprising a photopolymerizable layer containing an elastomeric binder, a monomer, and a photoinitiator, interposed between a support and a cover sheet or multilayer cover element. A preferred process of making such photosensitive elements is described in U.S. Pat. No. 4,460,675 where a previously extruded photopolymerizable composition is fed into the nip of a calender and is calendered between a support and a multilayer cover element to form a photopolymerizable layer. Upon imagewise exposure of the photosensitive element with actinic radiation through a photomask, the exposed areas of the photopolymerizable layer are insolubilized by photopolymerization. Treatment with a suitable solvent or solvent mixture removes the unexposed areas of the photopolymerizable layer leaving a printing relief which can be used for flexographic printing. Such materials and processes are described in U.S. Pat. No. 4,323,637; U.S. Pat. No. 4,427,759; and U.S. Pat. No. 4,894,315.

A common technique for bringing a photosensitive element and a photomask into close contact with one another is to juxtapose the elements and draw a vacuum from between them usually by use of a vacuum frame. Furthermore, digital methods and associated recording materials that do not require a separate photomask have been developed and are described in WO 94/03838, WO 94/03839, WO 96/16356, and EP 0767 407. Such recording materials comprise a conventional photopolymerizable layer, as previously described, and additionally a layer capable of forming an integrated photomask. The additional layer is sensitive to infrared radiation and opaque to actinic radiation, a so called infrared sensitive layer. This infrared sensitive layer is imaged digitally, whereby the infrared sensitive material is imagewise vaporized or transferred to a superposed film. Subsequent overall exposure with actinic radiation of the photopolymerizable element through the resulting integrated photomask, washing off unpolymerized areas and remaining areas of the infrared sensitive layer, and drying the element yield a flexographic printing plate.

However, developing the exposed photosensitive element with a solvent or solvent mixture is time consuming since drying for extended period (0.5 to 24 hours) is necessary to remove entrained developer solution. In addition, these developing systems produce potentially toxic by-product wastes (both the solvent and any material carried off by the solvent) during the development process.

To avoid the problems with solution development, a "dry" thermal development process may be used. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). In all these cited patents imagewise exposure is conducted with a silver halide film target in a vacuum frame. The exposed portions of the photosensitive layer remain hard, that is, do not soften or melt, at the softening temperature for the unexposed portions. The absorbent material collects the softened un-irradiated material and then is separated and/or removed from the photosensitive layer. The cycle of heating and contacting the photosensitive layer may need to be repeated several times in order to sufficiently remove the flowable composition from the un-irradiated areas and form a relief structure suitable for printing. Thus remains a raised relief structure of irradiated, hardened composition that represents the desired printing image.

Finally, the flexographic printing plate prepared by any of the described processes, that is, the plate having the relief pattern already formed, may be post exposed and/or chemically or physically after-treated in any sequence to detackify the surface of the flexographic printing plate. Preferably, UV radiation with a wavelength not longer than 300 nm is used for post-exposure for detackification, as disclosed in European Published Patent Application 0 017927 and in U.S. Pat. No. 4,806,506.

However with increasing demands on quality, the current state-of-the-art flexographic printing plates may not perform as desired. In particular, thermally developed flexographic printing plates may poorly transfer ink to the substrate resulting in print defects. Unsatisfactory printing results are especially obtained with solvent based printing inks, and with UV-curable printing inks. For flexographic printing plates having poor ink transfer, a higher amount of physical impression is necessary during printing to increase the tonal density of solid image areas. But higher impression leads to higher dot gain in screened image areas. Especially, when printing on critical printing materials like, for example, foils, a lot of print defects can be observed. Also, flexographic printing plates developed with solvents may be not sufficiently resistant to the developing solvent diffusing into the plates. This leads to swelling of the plates resulting in an increase of the plate thickness. To avoid such effects, long drying times are necessary to maintain print quality.

Therefore, it is an objective of the present invention to provide flexographic printing plates which show better ink transfer and/or less swelling in developer solvents in order to improve printing quality.

SUMMARY OF THE INVENTION

This objective is solved by a process for preparing a flexographic printing plate comprising in order a) providing a photosensitive element comprising a support, and at least one photopolymerizable layer comprising at least one elastomeric binder, at least one ethylenically unsaturated compound photopolymerizable by actinic radiation, and at least one photoinitiator or photoinitiator system, b) providing a photomask adjacent the photopolymerizable layer opposite the support, c) exposing the photosensitive element with ultraviolet radiation between 200 and 300 nm through the photomask, d) exposing the photosensitive element with ultraviolet radiation between 310 and 400 nm through the photomask to photopolymerize areas of the photopolymerizable layer exposed to ultraviolet radiation, and e) treating the exposed photosensitive element to remove unpolymerized areas of the photopolymerizable layer not exposed to ultraviolet radiation, thereby forming a relief surface suitable for printing.

In a further embodiment, the invention is directed to a flexographic printing plate made by such a process.

DETAILED DESCRIPTION OF THE PREFERRED EMBODIMENT(S)

The essential feature of the present process is the first exposure step c), hereinafter called "pre-exposure step", of a photosensitive element with UV radiation with a wavelength between 200 and 300 nm, hereinafter called "UV-C radiation". This pre-exposure step is done before imagewise main exposure with UV radiation having a wavelength between 310 and 400 nm, hereinafter called "UV-A radiation". This pre-exposure step c) is applied to the outermost surface of the photosensitive element which forms the printing surface in the final flexographic printing plate. The pre-exposure step is done through a photomask, preferably through the same photomask used for imagewise main exposure. Optionally, the pre-exposure step with UV-C radiation is also done before overall back exposure through the support of the element. The present invention can easily be integrated in usual production processes of flexographic printing plates. No additional apparatus is necessary to accomplish the present process. A common apparatus, already used for "light-finishing" with UV-C radiation which is described below, can be used for the new pre-exposure step.

Surprisingly, the surface tension of flexographic printing plates can be enhanced by the present invention. A higher surface tension improves the wetting properties of the surfaces of flexographic printing plates, thereby improving the ink transfer to the printing material and achieving smoother ink lay down in solid areas. The tonal densities of solid image areas can be increased by the use of the present invention, especially on critical printing materials, for example foils, which are difficult to be printed.

The present invention provides an easy and economical way to prepare flexographic printing plates with improved ink transfer, especially for UV curable printing inks and solvent based printing inks. Preferably, thermally developed flexographic printing plates made by the present invention allow the use of lower impression during flexographic printing, whereby a higher tonal density of solid image areas as well as improved dot gain in screened image areas are achieved.

A main advantage of the present invention is that it can be adopted for various types of photosensitive elements. Preferably, the present invention is useful with photosensitive elements which can be thermally developed. The present invention is useful for photosensitive elements which are analog exposed, i.e., imagewise exposure through a film phototool, as well as photosensitive elements which are digitally exposed, i.e., imagewise exposed through an in-situ mask formed by laser radiation. Especially preferred are digital photosensitive elements developable by thermal treatment. Therefore, the printing quality can be optimized very easy without the need to reformulate the photosensitive elements.

Additionally, flexographic printing plates made by the present invention and developed with wash-out solvents, preferably with organic wash-out solutions, show less swelling in the developing solution. So, drying times of the solvent treated flexographic printing plates can be reduced.

The skilled artisan had expected problems with photosensitive elements being exposed to UV-C radiation before the imagewise main exposure. The pre-exposure could have hindered the imagewise photopolymerization and prevent image areas from being firmly fixed to the floor.

Photosensitive Element

Photopolymerizable Layer

The first step of the present process is to provide a photosensitive element. The photosensitive element comprises a support, and at least one photopolymerizable layer. As used herein, the term "photopolymerizable" is intended to encompass systems that are photopolymerizable, photocrosslinkable, or both. The photopolymerizable layer of the photosensitive element for use as flexographic printing plate consist of known photopolymerizable materials. Photopolymerizable materials which are soluble, swellable, or dispersible in aqueous, semi-aqueous, or organic solvent developers (so called wet developable materials) as well as photopolymerizable materials which are thermally developable are suitable for the present process. Examples of suitable compositions for solvent development have been disclosed, for example, in U.S. Pat. No. 4,323,637; U.S. Pat. No. 4,427,759; and U.S. Pat. No. 4,894,315. Most advantageous results are obtained with thermally developable photopolymerizable materials. When thermally developable photosensitive elements are used, the photopolymerizable materials are capable of at least partially liquefying upon thermal development. That is, during thermal development the uncured materials must soften or melt or flow at a reasonable processing or developing temperature but not be subject to cold flow, i.e., dimensional change, during normal storage.

All photopolymerizable materials of the state of the art can be used in the present process. State-of-the-art photopolymerizable materials typically comprise at least one elastomeric binder, at least one photopolymerizable, ethylenically unsaturated monomer, and at least one photoinitiator or photoinitiator system, wherein the photoinitiator is sensitive to actinic radiation. Throughout this specification, actinic radiation (or actinic light) will include ultraviolet radiation and/or visible light.

Examples of elastomeric binders are polyalkadienes, alkadiene/acrylonitrile copolymers; ethylene/propylene/alkadiene copolymers; ethylene/(meth)acrylic acid(meth)acrylate copolymers; and thermoplastic, elastomeric block copolymers of styrene, butadiene, and/or isoprene. Linear and radial thermoplastic, elastomeric block copolymers of styrene and butadiene and/or isoprene are preferred.

For thermally developable photosensitive elements, a thermoplastic binder is used, preferably a thermoplastic, elastomeric binder. The thermoplastic binder can be a single polymer or mixture of polymers. Binders include natural or synthetic polymers of conjugated diolefin hydrocarbons, including polyisoprene, 1,2-polybutadiene, 1,4-polybutadiene, and butadiene/acrylonitrile. Preferably, the thermoplastic binder is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Suitable thermoplastic elastomeric binders of this type include poly(styrene/isoprene/styrene) block copolymers and poly(styrene/butadiene/styrene) block copolymers which are preferred. The non-elastomer to elastomer ratio is preferably in the range of from 10:90 to 35:65. Most preferably the thermoplastic elastomeric binder is a mixture of at least two poly(styrene/isoprene/styrene) block copolymers as described by Dudek et al. in U.S. Pat. No. 5,972,565. It is preferred that the binder be present in an amount of at least 60% by weight of the photosensitive layer.

The term binder, as used herein, encompasses core shell microgels and blends of microgels and preformed macromolecular polymers, such as those disclosed in Fryd et al., U.S. Pat. No. 4,956,252 and Quinn et al., U.S. Pat. No. 5,707,773.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a more complete description of some of these materials see U.S. Pat. No. 5,015,556.

The photopolymerizable material contains at least one ethylenically unsaturated compound photopolymerizable by actinic radiation. Such compounds are also referred to as monomers.

Monomers that can be used in the photopolymerizable layer are well known in the art and include, but are not limited to, ethylenically unsaturated, copolymerizable, organic compounds, preferably such with at least one terminal ethylenically unsaturated group. Generally the monomers have relatively low molecular weights (less than about 30,000). Preferably, the monomers have a relatively low molecular weight less than about 5000, such as, for example, acrylates and methacrylates of monovalent or polyvalent alcohols; (meth)acrylamides; vinyl ethers and vinyl esters; etc., in particular acrylic and/or methacrylic esters of butanediol, hexanediol, diethylene glycol, trimethylol propane, pentaerythritol, etc.; and mixtures of such compounds.

If a polyacrylol oligomer is used, the oligomer should preferably have a molecular weight greater than 1000. A mixture of monofunctional and multifunctional acrylates or methacrylates may be used. Other examples of suitable monomers include acrylate and methacrylate derivatives of isocyanates, esters, epoxides and the like. Monomers can be appropriately selected by one skilled in the art to provide elastomeric property to the photopolymerizable composition. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than 20% by weight). Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. Preferably, the monomer or monomer mixture is present in an amount of at least 5%, preferably 10 to 20%, by weight by weight of the photopolymerizable material.

Suitable photoinitiators are individual photoinitiators or photoinitiator systems, such as, for example, quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogeno acetophenone, oxysulfonyl ketones, sulfonyl ketones, oxysulfonyl ketones, sulfonyl ketones, benzoyl oxime esters, thioxanthones, camphorquinones, ketocoumarin, Michler's ketone, etc., also mixed with triphenyl phosphine, tertiary amines, etc. Preferably, the initiator is sensitive to ultraviolet or visible radiation, most preferably to ultraviolet radiation having a wavelength between 310 and 400 nm. Photoinitiators are generally present in an amount of 0.001-10.0% by weight of the photopolymerizable material.

In addition to the main components described in the foregoing, the photopolymerizable material may comprise conventional additives depending on the final properties desired like, for example, thermal polymerization inhibitors, plasticizers, sensitizers, colorants, antioxidants, antiozonants, fillers, rheology modifiers, processing aids, etc,. Processing aids may be such things as low molecular weight polymers compatible with the elastomeric block copolymer, such as low molecular weight alpha-methylstyrene polymer or copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate. Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; and liquid polyisoprene. Generally, plasticizers are liquids having molecular weights of less than about 5000, but can have molecular weights up to about 30,000. Plasticizers having low molecular weight will encompass molecular weights less than about 30,000.

The thickness of the photopolymerizable layer can vary over a wide range depending upon the type of flexographic printing plate desired. For so called "thin plates" the photopolymerizable layer can be from about 0.05-0.17 cm in thickness. Thicker plates will have a photopolymerizable layer up to 0.25-0.64 cm in thickness or greater.

Additional Layers

Additional layers may be present on top of the photopolymerizable layer, that is, on a side of the photopolymerizable layer opposite the support. Suitable layers are those disclosed as elastomeric layers in the multilayer cover element described in U.S. Pat. No. 4,427,759 and U.S. Pat. No. 4,460,675. Such elastomeric layers comprise layers which are insensitive to actinic radiation themselves but become photosensitive when contacted with the photopolymerizable layer as well as such layers which are photosensitive themselves. These photosensitive elastomeric layers comprise preferably an elastomeric binder, a monomer, and a photoinitiator, and optionally fillers or other additives. Elastomeric layers which become photosensitive when contacted with the photopolymerizable layer do not comprise any monomer. Binder, monomer, and other compounds can be the same or similar to those compounds comprised in the photopolymerizable layer. These elastomeric layers are disposed above the photopolymerizable layer.

In a preferred embodiment of the present invention, the photosensitive element comprises an infrared (IR)-sensitive layer on top of the photopolymerizable layer or on top of the elastomeric layer if present. The IR-sensitive layer can form an integrated masking layer for the photosensitive element. The preferred IR-sensitive layer is removable during treating, i.e., soluble or dispersible in a developer solution or removable during thermal development; opaque to actinic radiation that is, has an optical density $\geq 2.5$; and can be imaged with an infrared laser. The IR sensitive layer contains material having high infrared absorption in the wavelength range between 750 and 20,000 nm, such as, for example, polysubstituted phthalocyanine compounds, cyanine dyes, merocyanine dyes, etc., inorganic pigments, such as, for example, carbon black, graphite, chromium dioxide, etc., or metals, such as aluminum, copper, etc. The quantity of infrared absorbing material is usually 0.1-40% by weight, relative to the total weight of the layer. To achieve the optical density of $\geq 2.5$ to block actinic radiation, the infrared-sensitive layer contains a material that prevents the transmission of actinic radiation. This actinic radiation blocking material can be the same or different than the infrared absorbing material, and can be, for example, dyes or pigments, and in particular the aforesaid inorganic pigments. The quantity of this material is usually 1-70% by weight relative to the total weight of the layer. The infrared-sensitive layer optionally includes a polymeric binder, such as, for example, nitrocellulose, homopolymers or copolymers of acrylates, methacrylates and styrenes, polyamides, polyvinyl alcohols, etc. Other auxiliary agents, such as plasticizers, coating aids, etc. are possible. The infrared-sensitive layer is usually prepared by coating or printing a solution or dispersion of the aforesaid components as a layer on the cover sheet, and subsequently drying it before applying the cover sheet to the top of the photopolymerizable layer. The thickness of the infrared-sensitive layer is usually 2 nm to 50 µm, preferably 4 nm to 40 µm. These infrared-sensitive layers and their preparation are described in detail, for example in WO 94/03838 and WO 94/3839.

Furthermore, the photosensitive element may optionally comprise a release layer on top of the photopolymerlzable layer or on top of the elastomeric layer if present. The release layer enables the easy removal of a mask used for the imagewise exposure of the photosensitive element. The release layer must be flexible, transparent, and non-tacky. It is usually a thin layer. preferably having a thickness of at least 0.5 microns, but less than 10 microns, more preferably less than 4 microns. The release layer preferably is removable during the normal development process. Suitable release layers may include polyamides, polyvinyl alcohols, polyurethanes, polyvinyl pyrrolidones, amphoteric interpolymers, hydroxy cellulosic polymers, polyethylene oxides, copolymers of ethylene and vinyl acetate, and combinations thereof. Optionally, the release layer may comprise inorganic or organic matting agents, colorants, e.g., dyes and/or pigments as well as photochromic additives, i.e., for identification or for better contrast between imaged and non-imaged areas of the photosensitive elements directly after imagewise exposure or after imagewise exposure and development. Especially release layers comprising matting agents capable of being anchored in the surface of the photopolymerizable layer are suitable like those described by Bode et al. in US Patent Publication No. US-2005-0196701-A1 published Sept. 8, 2005 (GP-1206).

The photosensitive element can optionally include a wax layer as disclosed in DE-C 199 09 152 or a barrier layer between the IR-sensitive layer and the photopolymerizable layer, or between the IR-sensitive layer and the elastomeric layer if present. Suitable waxes are all natural and synthetic waxes, such as polyolefin waxes, paraffin waxes, carnauba waxes, stearin waxes, and steramide waxes. Preferred are waxes with a softening temperature $\geq 70°$ C., especially polyethylene waxes having a softening temperature $\geq 90°$ C. Conventional methods like casting, printing, or spray coating are used to prepare the wax layers from dispersions of the waxes in suitable solvents. The wax layer is usually 0.02-1.0 µm thick, preferably 0.05-0.5 µm. In the case of an IR sensitive layer being present in the photosensitive element, the barrier layer may be placed between the photopolymerizable layer or the elastomeric layer and the IR sensitive layer. Materials suitable as the release layer described above, are also suitable as the barrier layer as described in U.S. Patents 5,262,275 and 5,719,009.

The photosensitive element can optionally include an adhesive layer between the support and the photopolymerizable layer. Such adhesive materials are disclosed in U.S. Pat. No. 3,036,913 or U.S. Pat. No. 2,760,863. Alternatively, the support can have an adhesion promoting surface by flame-treatment or electron-treatment or the adhesion of the photopolymerizable layer to the support can be enhanced by exposure to actinic radiation through the support.

Furthermore, the photosensitive element can optionally include an antihalation layer between the support and the photopolymerizable layer. Such antihalation layer can be made by dispersing a finely divided dye or pigment which substantially absorbs actinic radiation in a solution or aqueous dispersion of a resin or polymer which is adherent to both the support and the photopolymerizable layer and coating it on the support and drying. Suitable antihalation pigments and dyes include carbon black, manganese dioxide, Acid Blue Black (Cl 20470), and Acid Magenta O (Cl 42685). Suitable polymeric or resin carriers include polyvinyl compounds, e.g., polyvinyl chloride homo- and copolymers, copolymers of acrylic and methacrylic acid, etc.

Support

The photosensitive element can also comprise a support. The support can be any flexible material which is conventionally used with photosensitive elements for use as flexographic printing plates. Examples for suitable support materials include polymeric films such those formed by addition polymers and linear condensation polymers, transparent foams and fabrics, and metals such as aluminum. Preferably, the support is transparent to actinic radiation to accommodate overall back-exposure through the support, as described below. A preferred support is a polyester film; particularly preferred is polyethylene terephthalate. The support typically has a thickness from 0.001-0.030 inch. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves are also acceptable and may include an adhesive layer or tape between the layers of flexible material. The sleeve may also be made of non-transparent, actinic radiation blocking materials, such as nickel or glass epoxy. The sleeve typically has a wall thickness from 10 to 80 mils (0.025 to 0.203 cm) or more. Preferred wall thickness for the cylinder form is 10 to 40 mils (0.025 to 0.10 cm).

Cover Sheet

The photosensitive element optionally comprises a temporary cover sheet on top of the outermost layer of the photosensitive element. Useful cover sheets consist of flexible polymeric films, e.g., polystyrene, polyethylene, polypropylene, polycarbonate, fluoropolymers, polyamide or polyesters. Preferably, polyesters are used, especially polyethylene terephthalate. Mostly, the cover sheet is unsubbed, but optionally may be subcoated with a thin silicone layer.

Process for Preparing Photosensitive Elements

The photosensitive elements suitable for the present invention can be prepared by common techniques. The photopolymerizable layer itself may be prepared in many ways by admixing the binder, monomer, initiator, and other ingredients and forming it into a sheet layer. Generally, the photopolymerizable mixture is formed into a hot melt and then calendered to the desired thickness. An extruder can be used to perform the function of melting, mixing, deaerating and filtering the composition. The extruded mixture is then calendered between the support and a cover sheet or a cover element. Such cover element can comprise a cover sheet, and optionally one or more additional layer selected from the group consisting of an IR-sensitive layer, an elastomeric layer capable of becoming photosensitive, a release layer, and a wax layer. Alternatively, the photopolymerizable material can be placed between the support and the cover element in a mold. The layers of material are then pressed flat by the application of heat and/or pressure. The combination of extrusion/calendering process is particularly preferred.

Process for Preparing Flexographic Printing Plates

The essential step of the present invention, the pre-exposure of the photosensitive element with UV-C radiation with a wavelength between 200 and 300 nm is done directly before imagewise main exposure with UV-A radiation with a wavelength between 310 and 400 nm. Preferably the pre-exposure radiation is between 250 and 260 nm, most preferably 254 nm. Optionally, the pre-exposure step with UV-C radiation is also done before overall back exposure with UV-A radiation through the support of the element. The exposure time may vary from a few seconds to minutes, depending upon the intensity and spectral energy distribution of the radiation. Typically, an exposure time of 3-6 minutes is used for an UV-C energy of approximately 18 mW/cm$^2$. The higher the UV-C energy and/or the longer the exposure time, the higher is the surface tension of the flexographic printing plates and the better is the ink transfer. When solvent developable photosensitive elements are treated by the pre-exposure step, typically an exposure time>6 minutes is used for an UV-C energy of approximately 18 mW/cm$^2$, preferably an exposure time>7, most preferably>8 minutes. The photosensitive element is pre-exposed with UV-C radiation through the photomask which will be used for the imagewise main exposure. As sources of UV-C radiation there can be mentioned, for example low pressure mercury lamp, a high pressure mercury lamp, a germicidal lamp, and a heavy hydrogen lamp.

The photomask includes opaque areas and "clear" areas that form the image. The opaque areas of the photomask prevent the photopolymerizable material beneath from being exposed to the actinic radiation and hence these areas do not photopolymerize. The "clear" areas of the photomask expose the photopolymerizable layer beneath to actinic radiation and hence these areas photopolymerize. The image necessary for the imagewise exposure of the photopolymerizable layer can be generated by any method including conventional and digital methods, including inkjet application.

That means, the photomask can be a separate film, i.e., an image-bearing transparency or phototool, such as a silver halide film; or the photomask can be integrated with the photosensitive element as described above. In the case in which the photomask is a separate film, the optional cover sheet is usually stripped before imagewise exposure leaving the release layer on the photosensitive element. The photomask is brought into close contact with the release layer of the photosensitive element by the usual vacuum processes, e.g., by use of a common vacuum frame. Thus a substantially uniform and complete contact between the photosensitive element and the photomask can be achieved in acceptable time.

Preferably, an integrated photomask is used and therefore, an IR-sensitive layer is included in the photosensitive element. In this case, the step of UV-C pre-exposure is conducted after the photomask is formed by IR laser radiation. Therefore, the IR-sensitive layer is imagewise exposed to IR laser radiation to form the photomask on the photosensitive element. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. In so-called digital imaging, the radiation opaque layer is exposed imagewise to infrared laser radiation to form the image on or disposed above the photopolymerizable layer, i.e., the in-situ mask. The infrared laser radiation can selectively remove, e.g., ablate or vaporize, the infrared sensitive layer (i.e., radiation opaque layer) from the photopolymerizable layer, as disclosed by Fan in U.S. Pat. Nos. 5,262,275 and 5,719,009; and Fan in EP 0 741 330 B1. The integrated photomask remains on the photosensitive element for subsequent steps of UV pre-exposure, imagewise main exposure to actinic radiation and development.

In another digital method of mask formation, the photosensitive element will not initially include an infrared sensitive layer. In this case the infrared sensitive layer is the same as or substantially the same as the infrared sensitive layer included with the photosensitive layer as described above. A separate element bearing the infrared sensitive layer will form an assemblage with the photosensitive element such that the infrared sensitive layer is adjacent the surface of the photosensitive element opposite the support, which is typically the photopolymerizable layer. The separate element may include one or more other layers, such as ejection layers or heating layers, to aid in the digital exposure process. The assemblage is exposed imagewise with infrared laser radiation to selectively transfer the infrared sensitive layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. Only the portions of the infrared sensitive layer which were transferred will reside on the photosensitive element forming the in situ mask.

Further, the mask image may be created on a separate carrier and then transferred by application of heat and/or pressure to the surface of the photopolymerizable layer opposite the support. The photopolymerizable layer is typically tacky and will retain the transferred image. The separate carrier can then be removed from the element prior to the pre-exposure and/or the imagewise exposure. The separate carrier may have an infrared sensitive layer that is imagewise exposed to laser radiation to selectively remove the material and form the image. An example of this type of carrier is LaserMask® imaging film by Rexam, Inc.

Upon imagewise main exposure to actinic radiation, the radiation-exposed areas of the photopolymerizable layer are converted to the insoluble state with no significant polymerization or crosslinking taking place in the unexposed areas of the layer.

Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VLNHO/180, 115w), and the Philips UV-A "TL"-series low-pressure mercury-vapor fluorescent lamps. Typically, a mercury vapor arc or a sunlamp can be used at a distance of about 1.5 to about 60 inches (about 3.8 to about 153 cm) from the photosensitive element. These radiation sources generally emit long-wave UV radiation between 310-400 nm. The exposure time may vary from a few seconds to minutes, depending upon the intensity and spectral energy distribution of the radiation, its distance from the photosensitive element, and the nature and amount of the photopolymerizable material.

An overall back exposure through the support may be conducted before, after or during, preferably after, the imagewise exposure to polymerize a predetermined thickness of the photopolymer layer adjacent the support. This polymerized portion of the photopolymer layer is designated a floor. The floor provides improved adhesion between the photopolymerizable layer and the support, helps highlight dot resolution and also establishes the depth of the plate relief. The floor thickness varies with the time of exposure, exposure source, etc. This exposure may be with diffuse or directed radiation. All radiation sources suitable for imagewise main exposure may be used. The exposure is generally for 1-30 minutes.

Following imagewise main exposure to UV-A radiation through the mask and removal of the photomask if it is a separate film, the photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. For photosensitive elements including a separate IR-sensitive layer for digital formation of the mask, the treating step that forms the relief image in the photopolymerizable layer may also remove the mask image (which had been exposed to actinic radiation).

Treatment of the photosensitive printing element includes (1) "wet" development wherein the photopolymerizable layer is contacted with a suitable developer solution to washout unpolymerized areas and (2) "dry" development wherein the photosensitive element is heated to a development temperature which causes the unpolymerized areas of the photopolymerizable layer to melt or soften or flow and is wicked away by contact with an absorbent material. Dry development may also be called thermal development.

Wet development is usually carried out at about room temperature. The developers can be organic solvents, aqueous or semi-aqueous solutions, or water. The choice of the developer will depend primarily on the chemical nature of the photopolymerizable material to be removed. Suitable organic solvent developers include aromatic or aliphatic hydrocarbon, and aliphatic or aromatic halohydrocarbon solvents, for example, n-hexane, petrol ether, hydrated petrol oils, limonene or other terpenes or toluene, isopropyl benzene, etc., ketones such as methyl ethyl ketone, halogenated hydrocarbons such as chloroform, trichloroethane, or tetrachloroethylene, esters such as acetic acid or acetoacetic acid esters, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602. Additives such as surfactants or alcohols may be used.

Development time can vary, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the unexposed portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary, however, typically the plate is dried for 60 to 200 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to soften or melt or flow, and contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described by Martens in U.S. Pat. Nos. 5,015,556; 5,175,072; 5,215,859; and by Wang et al. in WO 98/13730.

The term "melt" is used to describe the behavior of the unirradiated portions of the photopolymerizable elastomeric layer subjected to an elevated temperature that softens and reduces the viscosity to permit flow and absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with an absorbent material can be done at the same time, or in sequence provided that the uncured portions of the photopolymerizable layer are still soft or in a melt state when contacted with the absorbent material. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the absorbent material with the photopolymerizable layer that is molten in the uncured regions, a transfer of the uncured photosensitive material from the photopolymerizable layer to the absorbent material takes place. While still in the heated condition, the absorbent material is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the absorbent material to the photopolymerizable layer (while the uncured portions are melting) may be maintained by the pressing the layer and the absorbent material together.

A preferred apparatus to thermally develop the photosensitive element is disclosed by Peterson et al. in U.S. Pat. No. 5,279,697, and also by Johnson et al. in Patent Cooperation Treaty Application No. PCT/US00/24400, and published as WO 01/18604 A2. The photosensitive element may be placed on a drum or a planar surface in order for thermal treatment to be carried out. The absorbent material is selected having a melt temperature exceeding the melt temperature of the uncured portions of the photopolymerizable layer and having good tear resistance at the same operating temperatures. Preferably, the selected material withstands the temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition as measured by the grams of elastomer that can be absorbed per square millimeter of the absorbent material. Preferred is a non-woven nylon web.

It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

After the development step, the photosensitive element can be uniformly post-exposed to ensure that the photopolymerization process is complete and that the so formed flexographic printing plate will remain stable during printing and storage. This post-exposure step can utilize the same radiation source as the imagewise main exposure.

Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Different finishing methods may also be combined.

EXAMPLES

In the following examples, all percentages are by weight unless otherwise noted. CYREL® photopolymer printing plates, CYREL® exposure unit, CYREL® Fast 1000 TD processor, CYREL® Digital Imager, CYREL® 1002 light finisher, CYREL® FLEXOSOL® developing solution are all available from The DuPont Company (Wilmington, Del.)

Example 1

The following example demonstrates the process of this invention wherein a flexographic printing plate has a surface energy that is increased by exposing an outermost surface of the plate to UV radiation with a wavelength between 200 and 300 nm (UV-C exposure), prior to imagewise main exposure.

A CYREL flexographic printing plate, type DFH (45 mil), was prepared as follows for Example 1. The plate included on a support a photopolymerizable layer of an elastomeric binder, ethylenically unsaturated compounds, a photoinitiator and other conventional additives, an infrared-sensitive actinic radiation opaque layer (digital layer) on a side opposite the support, and a temporary coversheet on the digital layer. The temporary coversheet was removed and the plate was imagewise exposed to infrared laser radiation in a CYREL Digital Imager to selectively ablate the digital layer and form a photomask on the photopolymerizable layer. The plate was exposed through the photomask on a CYREL Light Finisher for 6 minutes to ultraviolet radiation between 230-280 nm (UV-C radiation) with an output of 17.4 mW/cm$^2$ (mean average value, determined on Kuhnast UVC meter). The plate was then exposed through the photomask on a CYREL exposure unit for 10 minutes to ultraviolet radiation at about 354 nm. The plate was exposed through the support on the exposure unit with ultraviolet radiation at 354 nm to form a floor. The plate was thermally developed in a CYREL FAST TD1000 processor using recommended processing conditions for 45 mil plates. Thermal development was conducted by contacting the plate to a CYREL®FAST DR37 developer roll material carried over a heated roll at a temperature of about 325° F., for 11 cycles. A relief structure suitable for flexographic printing was formed in the plate. The plate was then given a finishing and post exposure for 6 minutes on the 1002 light finisher.

As a Control, a second plate of the same type was exposed and processed as described above except that the second plate was not exposed to UV-C radiation prior to the main imagewise exposure at 354 nm. The only exposure to UV-C radiation was in the final exposure step (after thermal processing to form the relief surface). The plate was given a series of exposure times stepped off in 5 minute increments from 0 to 30 minutes.

The surface energy of the plates of Example 1 and the Control were evaluated using ARCOTEC inks each having a different surface energy of 28, 32, 35, 38, 41, 44, 48 m-N/m (milli-Newtons/meter). The surface energy of the plate was determined by matching to the surface energy of the ink. A droplet or two of ink of known surface energy was applied to the plate surface. If the ink beaded up on the plate, the surface energy of the plate did not match. If the ink spread out on the plate surface, the surface energy of the plate matched that of the ink. Droplets of each of the inks of known surface energy would be applied to the plate surface until the droplets spread, and thus indicate the surface energy of the plate.

The surface energy for the plate of Example 1 was greater than 48 m-N/m (milli-Newton/meter). The surface energy for the Control plate was less than 28 m-N/m. The Control plate exhibited substantially the same surface energy for all UV-C exposure steps, that is a surface energy less than 28 m-N/m. The plate of Example 1 had greater wetting of the ink than that of the Control plate.

Example 2

The process of Example 1 was repeated with the same plate type, except that the plate was given a series of exposure times of the UV-C radiation, with an output of 18 mW/cm$^2$ prior to the main imagewise exposure at 354 nm. The plate was exposed to the UV-C for 0.5, 1.0, 1.5, 2.0, 3.0, and 4.0 minutes. All other steps and conditions remained the same.

The surface energy of the plate surface was tested with inks of known surface energy at each UV-C pre-exposure step as described above. The results are in the following table and show that surface energy of the plate increases with increasing UV-C exposure.

| UV-C Exposure Time (prior to Main Exposure) | Surface Energy (m-N/m) |
|---|---|
| 0.5 | <28 |
| 1.0 | <28 |
| 1.5 | Appx. 35 |
| 2.0 | 35-38 |
| 3.0 | Appx. 44 |
| 4.0 | >48 |

Example 3

The following example demonstrates that the time of UV-C-exposure for the pre-exposure step has a tremendous influence on the plate-geometry after the washout-process.

The digital layer of a CYREL® digital flexographic printing plate, type DPI45, was completely ablated with a CYREL® digital imager, using an IR radiation light source. The plate with the ablated surface was cut into ten sample pieces of a similar size (approx. 170×200 mm).

Each of the samples was exposed with UV-C-light (approx. 18 mW/cm$^2$), but the exposure times were different. The duration varied from 0 minutes to 9 minutes in steps of 1 minute. Therefore the sample with 0 minutes UV-C-exposure can be regarded as a standard processed plate. After the UV-C exposure, all samples were main exposed with UV-A-light for 10 minutes and given an exposure through the support side (32 sec). Finally the samples were processed with CYREL® FLEXOSOL® on a CYREL® Smart 1002-solvent washer and put in a dryer at 60° C.

The weight and the thickness of the samples were observed through the entire process by doing measurements after certain periods of time. The following table shows the results:

| sample | PreFin-time | [min] | 0 | 1 | 2 | 3 | 4 | 5 | 6 | 7 | 8 | 9 |
|---|---|---|---|---|---|---|---|---|---|---|---|---|
| engraved plate | hardn. | [shore A] | 58.9 | 58.7 | 58.7 | 58.9 | 58.1 | 58.7 | 58.9 | 58.7 | 58.7 | 58.7 |
|  | thickn. | [mm] | 1.189 | 1.193 | 1.19 | 1.188 | 1.192 | 1.191 | 1.19 | 1.19 | 1.193 | 1.187 |
|  | weight | [g] | 42.4 | 42.92 | 42.63 | 42.45 | 42.28 | 42.56 | 42.17 | 42.1 | 42.8 | 41.92 |
| after Pre-finish | time | min | 0 | 1 | 2 | 3 | 4 | 5 | 6 | 7 | 8 | 9 |
|  | hardn. | [shore A] | 58.7 | 59.1 | 61.1 | 61.5 | 60.9 | 62.9 | 63.1 | 63.9 | 63.9 | 64.5 |
|  | rel deviation |  | −0.34% | 0.68% | 4.09% | 4.41% | 4.82% | 7.16% | 7.13% | 8.86% | 8.86% | 9.88% |
|  | thickn. | [mm] | 1.188 | 1.193 | 1.188 | 1.184 | 1.187 | 1.185 | 1.183 | 1.184 | 1.188 | 1.181 |
|  | rel. deviation |  | −0.08% | 0.00% | −0.17% | −0.34% | −0.42% | −0.50% | −0.59% | −0.50% | −0.42% | −0.51% |
|  | weight | [g] | 42.42 | 42.94 | 42.64 | 42.46 | 42.29 | 42.59 | 42.17 | 42.11 | 42.82 | 41.93 |
|  | rel. deviation |  | 0.05% | 0.05% | 0.02% | 0.02% | 0.02% | 0.07% | 0.00% | 0.02% | 0.05% | 0.02% |
| after ME (10 min), BE (32 s) | hardn. | [shore A] | 71.9 | 74.3 | 75.1 | 75.1 | 75.1 | 75.1 | 75.9 | 75.7 | 75.5 | 75.3 |
|  | rel. deviation |  | 22.07% | 26.58% | 27.94% | 27.50% | 29.26% | 27.94% | 28.86% | 28.96% | 28.62% | 28.28% |
|  | thickn. | [mm] | 1.172 | 1.176 | 1.174 | 1.172 | 1.175 | 1.174 | 1.174 | 1.175 | 1.178 | 1.173 |
|  | rel. deviation |  | −1.43% | −1.42% | −1.34% | −1.35% | −1.43% | −1.43% | −1.34% | −1.26% | −1.26% | −1.18% |
|  | weight | [g] | 42.41 | 42.92 | 42.62 | 42.44 | 42.28 | 42.56 | 42.16 | 42.1 | 42.81 | 41.91 |
|  | rel. deviation |  | 0.02% | 0.00% | −0.02% | −0.02% | 0.00% | 0.00% | −0.02% | 0.00% | 0.02% | −0.02% |
| after Processing, 15 min drying | thickn. | [mm] | 1.28 | 1.335 | 1.322 | 1.321 | 1.31 | 1.306 | 1.281 | 1.245 | 1.205 | 1.189 |
|  | rel. deviation |  | 7.65% | 11.90% | 11.09% | 11.20% | 9.90% | 9.66% | 7.65% | 4.62% | 1.01% | 0.17% |
|  | weight | [g] | 45.9 | 47.91 | 47.26 | 46.97 | 46.19 | 46.47 | 45.31 | 44.15 | 43.6 | 42.42 |
|  | rel. deviation |  | 8.25% | 11.63% | 10.86% | 10.65% | 9.25% | 9.19% | 7.45% | 4.87% | 1.87% | 1.19% |
| after Processing, 30 min drying | thickn. | [mm] | 1.273 | 1.311 | 1.303 | 1.297 | 1.288 | 1.284 | 1.266 | 1.241 | 1.207 | 1.191 |
|  | rel. deviation |  | 7.06% | 9.89% | 9.50% | 9.18% | 8.05% | 7.81% | 6.39% | 4.29% | 1.17% | 0.34% |
|  | weight | [g] | 45.16 | 47.05 | 46.44 | 45.98 | 45.34 | 45.76 | 44.84 | 43.9 | 43.49 | 42.34 |
|  | rel. deviation |  | 6.51% | 9.62% | 8.94% | 8.32% | 7.24% | 7.52% | 6.33% | 4.28% | 1.61% | 1.00% |
| after Processing, 45 min drying | thickn. | [mm] | 1.242 | 1.284 | 1.278 | 1.279 | 1.272 | 1.274 | 1.26 | 1.24 | 1.209 | 1.192 |
|  | rel. deviation |  | 4.46% | 7.63% | 7.39% | 7.66% | 6.71% | 6.97% | 5.88% | 4.20% | 1.34% | 0.42% |
|  | weight | [g] | 44.2 | 45.97 | 45.54 | 45.27 | 44.81 | 45.25 | 44.49 | 43.69 | 43.39 | 42.26 |
|  | rel. deviation |  | 4.25% | 7.11% | 6.83% | 6.64% | 5.98% | 6.32% | 5.50% | 3.78% | 1.38% | 0.81% |
| after Processing, 60 min drying | thickn. | [mm] | 1.226 | 1.263 | 1.259 | 1.263 | 1.259 | 1.263 | 1.253 | 1.236 | 1.206 | 1.192 |
|  | rel. deviation |  | 3.11% | 5.87% | 5.80% | 6.31% | 5.62% | 6.05% | 5.29% | 3.87% | 1.09% | 0.42% |
|  | weight | [g] | 43.7 | 45.38 | 45.04 | 44.84 | 44.42 | 44.95 | 44.34 | 43.68 | 43.42 | 42.29 |
|  | rel. deviation |  | 3.07% | 5.73% | 5.65% | 5.63% | 5.06% | 5.62% | 5.15% | 3.75% | 1.45% | 0.88% |
| after Processing, 75 min drying | thickn. | [mm] | 1.219 | 1.255 | 1.255 | 1.258 | 1.255 | 1.259 | 1.252 | 1.235 | 1.207 | 1.193 |
|  | rel. deviation |  | 2.52% | 5.20% | 5.46% | 5.89% | 5.29% | 5.71% | 5.21% | 3.78% | 1.17% | 0.51% |
|  | weight | [g] | 43.42 | 45.06 | 44.74 | 44.56 | 44.21 | 44.71 | 44.17 | 43.59 | 43.34 | 42.28 |
|  | rel. deviation |  | 2.41% | 4.99% | 4.95% | 4.97% | 4.56% | 5.05% | 4.74% | 3.54% | 1.26% | 0.86% |
| after Processing, 90 min drying | thickn. | [mm] | 1.211 | 1.252 | 1.244 | 1.249 | 1.247 | 1.256 | 1.249 | 1.235 | 1.21 | 1.193 |
|  | rel. deviation |  | 1.85% | 4.95% | 4.54% | 5.13% | 4.61% | 5.46% | 4.96% | 3.78% | 1.42% | 0.51% |
|  | weight | [g] | 43.25 | 44.85 | 44.55 | 44.4 | 44.05 | 44.63 | 44.12 | 43.56 | 43.36 | 42.3 |
|  | rel. deviation |  | 2.00% | 4.50% | 4.50% | 4.59% | 4.19% | 4.86% | 4.62% | 3.47% | 1.31% | 0.91% |
| after Processing, 120 min drying | thickn. | [mm] | 1.205 | 1.242 | 1.238 | 1.239 | 1.243 | 1.247 | 1.244 | 1.233 | 1.206 | 1.193 |
|  | rel. deviation |  | 1.35% | 4.11% | 4.03% | 4.29% | 4.28% | 4.70% | 4.54% | 3.61% | 1.09% | 0.51% |
|  | weight | [g] | 43 | 44.57 | 44.24 | 44.04 | 43.76 | 44.34 | 43.93 | 43.47 | 43.33 | 42.24 |
|  | rel. deviation |  | 1.42% | 3.84% | 3.78% | 3.75% | 3.50% | 4.18% | 4.17% | 3.25% | 1.24% | 0.76% |
| after Processing, 300 min drying | hardn. | [shore A] | 73.9 | 73.1 | 73.5 | 74.1 | 74.1 | 74.3 | 73.1 | 73.5 | 73.1 | 74.7 |
|  | rel deviation |  | 25.47% | 24.53% | 25.21% | 25.81% | 27.54% | 26.58% | 24.11% | 25.21% | 24.53% | 27.26% |
|  | thickn. | [mm] | 1.175 | 1.211 | 1.202 | 1.202 | 1.208 | 1.21 | 1.219 | 1.216 | 1.2 | 1.189 |
|  | rel. deviation |  | −1.18% | 1.51% | 1.01% | 1.18% | 1.34% | 1.60% | 2.44% | 2.18% | 0.59% | 0.17% |

| sample | PreFin-time | [min] | 0 | 1 | 2 | 3 | 4 | 5 | 6 | 7 | 8 | 9 |
|---|---|---|---|---|---|---|---|---|---|---|---|---|
| | weight | [g] | 42.09 | 43.43 | 43.15 | 42.98 | 42.83 | 43.3 | 43.18 | 43.04 | 43.18 | 42.16 |
| | rel. deviation | | −0.73% | 1.19% | 1.22% | 1.25% | 1.30% | 1.74% | 2.40% | 2.23% | 0.89% | 0.57% |

The data of the relative change of thickness versus drying time and the relative change of weight versus drying time were plotted on graphs. The data showed that the treatment with UV-C-light before main exposure can influence the swelling of a plate from the washout-process with solvent. Pre-exposure times 1 to 5 minutes for UV-C-exposure increased the swelling of the plate. Increasing the pre-exposure times of UV-C beyond about 5 minutes showed nearly no swelling or change of weight of the plate.

What is claimed is:

1. A process for preparing a flexographic printing plate comprising in order:
   a) providing a photosensitive element comprising a support, and at least one photopolymerizable layer comprising at least one elastomeric binder, at least one ethylenically unsaturated compound photopolymerizable by actinic radiation, and at least one photoinitiator or photoinitiator system;
   b) providing a photomask adjacent the photopolymerizable layer opposite the support;
   c) exposing the photosensitive element with ultraviolet radiation between 200 and 300 nm through the photomask;
   d) exposing the photosensitive element with ultraviolet radiation between 310 and 400 nm through the photomask to photopolymerize areas of the photopolymerizable layer exposed to ultraviolet radiation; and
   e) treating the exposed photosensitive element to remove unpolymerized areas of the photopolymerizable layer not exposed to ultraviolet radiation, thereby forming a relief surface suitable for printing.

2. The process of claim 1 wherein the photosensitive element further comprises an infrared sensitive ablation layer disposed above an outermost surface of the at least one photopolymerizable layer opposite the support, and in step b) the photomask is provided by imagewise exposing the infrared sensitive layer to infrared laser radiation.

3. The process of claim 2 wherein the infrared laser radiation ablates the infrared sensitive layer from the photopolymerizable layer.

4. The process of claim 1 wherein the photomask is a phototool film.

5. The process of claim 1 further comprising removing of the photomask after step d).

6. The process of claim 1 wherein the treating step e) is selected from the group consisting of
   (A) developing the exposed photosensitive element with at least one washout solution selected from the group consisting of solvent solution, aqueous solution, semi-aqueous solution, and water to wash away the unpolymerized areas; and
   (B) heating the exposed photosensitive element to a temperature sufficient to cause the unpolymerized areas to melt, flow, or soften, and contacting the exposed photosensitive element with an absorbent material to remove the unpolymerized areas.

7. The process of claim 1 wherein the photosensitive element further comprises at least one additional layer on top of an outermost surface of the photopolymerizable layer, the additional layer being selected from the group consisting of an elastomeric layer capable of becoming photosensitive, a photosensitive elastomeric layer, a release layer, and a wax layer.

8. The process of claim 7 further comprising an infrared sensitive laser ablation layer disposed above an outermost layer of the photosensitive element.

9. The process of claim 7 wherein the release layer comprises at least one matting agent.

10. A flexographic printing plate produced by the process of claim 1.

11. The process of claim 1 further comprising exposing the photosensitive element to ultraviolet radiation of 200 to 300 nm after the treating step e).

12. The process of claim 1 further comprising exposing the photosensitive element with ultraviolet radiation between 310 and 400 nm through the support.

13. The process of claim 12 wherein the step of exposing through the support occurs after step c) and before the treating step e).

* * * * *